United States Patent
Arora et al.

(10) Patent No.: US 8,530,389 B2
(45) Date of Patent: *Sep. 10, 2013

(54) PROCESS FOR THE PREPARATION OF OXIDE SUPERCONDUCTING RODS

(75) Inventors: Narinder Kumar Arora, New Delhi (IN); Gursharan Kaur Padam, New Delhi (IN); Ramesh Sethi, New Delhi (IN); Mukul Sharma, New Delhi (IN); Shrikant Narayan Ekbote, New Delhi (IN)

(73) Assignee: Council of Scientific & Industrial Research, New Delhi (IN)

( * ) Notice: Subject to any disclaimer, the term of this patent is extended or adjusted under 35 U.S.C. 154(b) by 1221 days.

This patent is subject to a terminal disclaimer.

(21) Appl. No.: 12/290,581

(22) Filed: Oct. 31, 2008

(65) Prior Publication Data

US 2009/0192043 A1     Jul. 30, 2009

(30) Foreign Application Priority Data

Jan. 25, 2008  (IN) .............................. 209/DEL/2008

(51) Int. Cl.
*H01L 39/24*    (2006.01)
*H01B 12/00*    (2006.01)

(52) U.S. Cl.
USPC ........... 505/430; 505/490; 505/492; 505/500; 505/220; 505/230; 174/125.1; 29/599

(58) Field of Classification Search
USPC ................. 505/220, 230, 231, 430, 431, 432, 505/441, 490–492, 500; 174/125.1; 29/599
See application file for complete search history.

(56) References Cited

U.S. PATENT DOCUMENTS 3,034,191 A * 5/1962 Schaefer et al. ................ 425/78
4,109,374 A * 8/1978 Whetstone et al. ............. 29/599

(Continued)

FOREIGN PATENT DOCUMENTS

JP   11-300725   * 11/1999
WO  WO 2005/096440  * 10/2005

OTHER PUBLICATIONS

Ekbote et al, "Preparation and characterization of Ag added Bi1.84Pb0.4Sr2Ca2.2Cu3)10+x bulk tube conductors for cryogen free superconducting magnet," Bull. Mater. Sci., 2001 Dec., V24, No. 6, pp. 603-609.*

(Continued)

*Primary Examiner* — Stanley Silverman
*Assistant Examiner* — Kallambella Vijayakumar
(74) *Attorney, Agent, or Firm* — Abelman, Frayne & Schwab

(57) ABSTRACT

An improved process for the preparation of oxide superconducting rods. The present invention provides a process for the preparation of oxide superconducting rods. The process includes the steps of a cold isopressing process without addition of binder, particularly thin and those based on Ag-added $(Bi,Pb)_2 Sr_2 Ca_2 Cu_3 O_{10+x}$ is disclosed. The main features of the process are the packing of partially preformed oxide superconducting powder obtained from spray drying a nitrate solution of Bi,Pb,Sr,Ca,Cu and Ag in a flexible rubber mould wrapped with a perforated metal sheet and whose inner surface is coated with olive oil, evacuating the packed partially preformed powder to remove trapped air and thereby reduces the defects and improves the subsequent cold isopressing to form rods; immediate cleaning the surface of the said rods so that no trace of olive oil is left; sintering initially the said rod in a silver tube/alumina sager, making silver metal contacts at both ends of the initially sintered rod; finally sintering the assembly of the said rod and both end silver metal contacts. The rods obtained according to these aspects show desired and consistent values of transport current not less than 36 Amp, contact resistance not more than 0.015 µOhm-cm² at 77K in self field and fracture strength not less than 140 MPa.

4 Claims, 4 Drawing Sheets

① PERFORATED MS SHEET
② RUBBER MOULD
③ OLIVE OIL LAYER
④ PARTIALLY PREFORMED
   (Bi, Pb)-2223 SUPERCONDUCTING POWDER
⑤ RUBBER CORK

(56) References Cited

U.S. PATENT DOCUMENTS

| | | | |
|---|---|---|---|
| 4,460,541 A * | 7/1984 | Singleton et al. | 419/42 |
| 7,722,918 B2 * | 5/2010 | Ekbote et al. | 427/62 |
| 2007/0213227 A1 * | 9/2007 | Ekbote et al. | 505/220 |
| 2007/0281862 A1 * | 12/2007 | Ekbote et al. | 505/470 |

OTHER PUBLICATIONS

Kenneth H. Sandhage et al., "Critical Issues in the OPIT Processing of High-Jc BSCCO Superconductors", JOM Mar. 1991, pp. 21-25.

Pradeep Haldar et al., "Processing and Transport Properties of High-Jc Silver-Clad Bi-2223 Tapes and Coils", Journal of Electronic Materials, vol. 22, No. 10, 1993, pp. 1295-1297.

K. Sato et al., "High-Jc Silver-Sheathed Bi-Based Superconducting Wires", IEEE Transactions on Magnetics, vol. 27, No. 2, Mar. 1991, pp. 1231-1238.

H. Kumakura et al., "Bi(Pb)-Sr-Ca-Cu-O superconducting composite tapes prepared by the powder method using an Ag sheath", J. Appl. Phys. 67 (7), 1 Apr. 1990, pp. 3443-3447.

M. Eyyiiphan Yakinci, "Fabrication of $(BiGaPb)2Sr2Ca2Cu3O10+y$ Glass-Ceramic Superconductor Rods.", Journal of Low Temperature Physics, vol. 105, Nos. 5/6, 1996, pp. 1535-1540.

Maeda, "Discovery and Progress in Bi-Based Oxide High Tc Superconductors", 1996, National Research Institute for Metals, p. 253.

* cited by examiner

① (Bi,Pb)-2223 SUPERCONDUCTOR
② SILVER METAL CONTACT PORTIONS

① PERFORATED MS SHEET
② RUBBER MOULD
③ OLIVE OIL LAYER
④ PARTIALLY PREFORMED
   (Bi, Pb)-2223 SUPERCONDUCTING POWDER
⑤ RUBBER CORK

PROCESS FOR THE PREPARATION OF OXIDE SUPERCONDUCTING RODS

FIELD OF THE INVENTION

The present invention relates to a process for the preparation of oxide superconducting rods. Particularly, the present invention relates to a process for the preparation of oxide superconducting rods which have small diameter. More particularly, the present invention relates to a process for the preparation of oxide superconducting rods made from Bismuth Strontium Calcium Copper Oxide for use in smaller scale applications such as cryogenic current lead in a low current magnet, scanners in space crafts, electronic devices and magnetometers and the like.

BACKGROUND OF THE INVENTION

To energize a superconducting magnet, electric current leads that connect current source equipment at room temperature with superconducting magnet at liquid helium temperature (4.2 K) for supplying a current of several ten amperes to several thousand amperes are used. The leads can also be used during magnet operation to assure a constant current flowing through the winding in the presence of non superconducting joints in the winding. These current leads are helium cooled to reduce the electrical resistance thereby suppressing not only the heat due to electric conduction but also the heat inflow by heat conduction through the cross section. The current lead conventionally used is a metallic copper wire with a large diameter which has low electrical resistance value. Although due to large diameter of the copper wire generation of Joule heat is reduced, however, heat penetration due to thermal conduction occurs to a side of the superconducting system at the same time. As a result, power loss of a crycooler and loss of the helium gas as a refrigerant due to the heat penetration become serious. When current leads are made using superconductor of zero electric resistance, the thermal losses due to resistance naturally becomes zero; the heat inflow is significantly reduced because of small cross section and the current capacity is several thousand times higher than the copper leads. Losses due to heat conduction can also be suppressed with the use of oxide superconductors which have low thermal conductivity. Due to these reasons, use of oxide superconductor which does not generate joule heat due to zero resistance and the small heat conduction due to their low thermal conductivity even if a large current is passed through it, is becoming high and at the same time these new leads save the electric power necessary for cooling to one third. Thus, current leads of oxide superconductors are very useful for both large scale as well as small scale applications. For example, in large scale applications such as in power generation and transmission lines high field magnets, current leads for low-$T_c$ superconducting magnets, particle, accelerators, magnetic energy storage systems etc. Some of the small scale applications are in cryogenic experiments, scanners in space crafts, low current magnets, electronic devices (communications/data systems and sensors etc.) and magnetometers etc.

Although, the higher electrical and lower thermal conductivity properties of oxide superconductors make them the better choice; however, their poor mechanical properties particularly in sintered bulk form limits their frequent use. Various efforts have been made to achieve all these critical properties to their best values. In conventional methods, wires of ductile materials are made by extrusion or by rolling and drawing processes. These processes cannot be directly applied to the oxide superconductors, due to their brittle nature and incapability of plastic deformation. Several variations of these processes are being developed, however, to adapt them to ceramic materials. These include the powder-in-tube (PIT) process used to fabricate metal-clad wires, plastic extrusion process used to fabricate bare wires and rods, floating zone, melt casting/cold isopressing techniques for fabricating bare rods; and cold isopressing for fabricating tubes.

The powder-in-tube process uses an adequate calcined oxide superconducting powder packed in a nominal ductile metal tube [K. H. Sandhage, G. Riley, and W. L. Carter, J. Minerals metals and material society, vol. 43, p. 21(1991); P. Halder, J. G. Hoehn, Jr. U. Balachandran, and L. R. Motowidlo, J. Electron. Materials, vol. 22, p. 1294 (1993); K. Sato, T. Hikka, H. Mukai, M. Ueyama, N. Shibuta, T. Kato, T. Masula, M. Nagata, K. Iwata, and T. Mitsui, IEEE Trans. Magn. MAG27, p. 1231(1991); R. Flukiger, B. Hensel, A. Jeremie, A. Perin, and L. C. Grievel, Appl. Supercond. vol. 1, p. 709(1993)]. A wire is rolled, drawn or both rolled and drawn in successive stages until the required diameter generally of 1 mm achieved. This wire is would into a coil and subsequently sintered under suitable optimized conditions so that mechanical strength itself was upgraded and reporting $J_c$ of the order of $10^4$ to $10^5$ A/cm$^2$ at 77 K in self field.

Although this method results in an oriented grain structure, however, drawback of this method is that there is a problem of not only degradation of contamination of the metallic cladding but also of losses due to high thermal conductivity of the cladding material.

Bare wires and/or rods made from extrusion, melting, cold isopressing methods and tubes made from cold isopressing technique are useful for applications like current leads where metallic cladding is undesirable. For example, for most of the large applications, such oxide current leads mostly made from rod/tube shape are currently being used in various equipments like cryogenic free cryocoolers. However, as compared to tubes not much effort has been made on the oxide current leads in rod shape because of their low $J_c$ values as compared to those of their tube counter parts. The reason for this behaviour is the dominance of the self-field due to current and which is inversely proportional to the diameter (ø) of the rod. That is by making rods of smaller diameter can minimize the problem of reduction in $J_c$ due to self-field. Apart from the problem due to self-field, thick rods also face the problem due to the presence of secondary phases which limit $J_c$. It is to note that the method of preparation of thick rods having diameter (4.2 mm) exist, however, those of the thin rods of diameter below 4.2 mm and approaching towards wire diameter (<2 mm) which can be very useful for small scale applications as mentioned above are not only scarce but also make use of either organic binders or lathe machine to fabricate thin rods. However, these methods have their own merits and demerits discussed below.

As is well established that [H. Kumakura, K. Togano and H. Maeda J. Appl. Phys., 67(1990)] the major factors influencing the properties particularly $J_c$ of BSCCO rods are the orientation, size of the grains and their distribution, the composition of the phases present and the mass density, these methods adopt appropriate mechanical working and heat treatments steps to achieve a highly oriented with uniform and smaller grain size polycrystalline microstructure.

The conventional plastic extrusion process consists of several stages mixing of preformed superconducting powder with a set of monomeric organic additives to form a paste, extrusion of the said paste into wires/rods of desired cross sections, solvent drying of the said extruded rods, burning of binder from the said dried rods followed by sintering.

Although this method gives direct rods and also induces a certain amount of orientation in the wire/rods, particularly on the surface, however, the combination of organics particularly, monomeric additives which do not lead to a good adhesion of particles and the processing parameters chosen could not result into an end product with desired and consistent electrical/superconducting and mechanical properties due to the crack formation during solvent drying and voids formation during binder burn out.

An improved version of the above method is disclosed in U.S. Pat. No. 6,191,074, by Ravi-Chander et al. using polymeric additives instead of monomeric additives and additional processing steps. This process involves formation of an extrudable paste by mixing superconducting material with polymeric additives that bridge between ceramic particles to provide inter particles adhesion, extrusion of the said paste into wires/rods, drying of the extruded rods, burning of binder, cold isopressing of the said rods followed by sintering in reduced oxygen environment with one intermediate cold isopressing step. With the use of polymeric additives and inclusion of cold isopressing of the binder burn-out rod before and in between sintering steps helped in achieving desired and consistent electrical and mechanical properties of YBCO and BSCCO superconducting wires/rods without degradation. The reported average value of $J_c$ was about 650 A/cm$^2$. However, this method suffers from the formation of fine cracks in the rod during intermediate cold isopressing.

The above problem of unavoidable crack and void formation due to the use of organic additives and solvents in the plastic deformation process can be prevented by using melt processes like floating zone and melt casting etc. Michishita et al. in Bismuth-based high-temperature superconductors, Edited by H. Maeda, K. Togano, Marcel Dekker, Inc. 1996, p. 253 disclosed a floating zone melt method for the fabrication of Bi-2223 rods. Electrical contacts were made by ultrasonic soldering of indium. Then reporting maximum $I_c$ of about 4.4 A (calculated value of $J_c$=880 A/cm$^2$) and contact resistivity ~$10^{-5}$-$10^{-6}$ $\Omega$-cm$^2$ at 77 K for 0.5×1×15 mm$^3$ rectangular bars with ultrasonically soldered indium contacts cut from the rods of 4 mm diameter and length of about 95 mm. Drawback of this method is that it resulted in to higher contact resistivity values.

Another drawback inherent in, this method is the requirement of very slow rates (<1 mm/hr) for the formation of high-Tc Bi-2223 phase which makes it a low output process in terms of product quantity. Moreover, the formation of reasonably good amount of high-Tc phase formation in this melt process has not been reported to date.

E. Yakinci in J. Low Temperature Phys; vol. 105, no. 516, p 1535 (1996) disclosed a melt casting technique for the fabrication of Bi-2223 rods having diameter of 13 mm and 200 mm long and adopted a new method of sintering by applying four stages direct current to the rods. In this method, a mixture of the raw materials $Bi_2O_3$, PbO, $Ga_2O_3$, $SrCO_3$, $CaCO_3$ and CuO was melted in platinum crucible. This highly viscous molten material was poured into the cold graphite crucible and obtained highly dense glass rod. Three steps sintering of this glass rod was performed by applying a direct current to the glass and reporting high $J_c$ of 9700 A/cm$^2$ at 4.2 K for the best optimized sample. However, these values are for small rectangular pieces (cut from these sintered rods) whose area has been calculated from cross-sectional scanning micrographs. Therefore, these values can not be considered to be representative of the as prepared rod which is to be used in devices. Further, this method suffers from presence of non-superconducting Ca, Cu rich phases even in the sample prepared under optimized conditions due to incongruent melting of the desired Bi-2223 phase (Flukiger et.al., Bismuth-Based High-Temperature Superconductors, edited by H. Maeda and K. Togano, Marcel Dekker, Inc. 1996,p. 319).

The problems of the above methods due to incorporation of organic additives or due to melting can be minimized by using another method of cold isopressing. This method involving cold isopressing of the calcined powder into rod followed by sintering with inclusion of one or two intermediate cold isopressing step which is known for spreading the intermediate Ca, Cu rich phases perpendicular to the packing direction thereby increasing density of the specimen during subsequent sintering steps has been disclosed in the following references with some variants.

In reference Bismuth-based high-temperature superconductors, Edited by H. Maeda, K. Togano, Marcel Dekker, Inc. 1996, p. 277 Yamada et al. and in EP Patent No.: CN1224246, Tiancheng et al. disclosed a cold isopressing (CIP) process of making Bi-2223 rod current leads. In the former method calcined powder synthesized from solid state route is packed into a rubber mold and formed into rods by CIP at 400 MPa obtained from heating of a mixture of carbonates/oxides to obtain a (Bi+Pb): Sr:Ca:Cu: ratio of 2:2:2:3. The cold isostatically pressed rods were sintered for 100 hours at 810-840° in an atmosphere of low $O_2$ partial press (Ar: $O_2$=12:1), and then the CIP of these sintered is performed again. Finally, silver is plasma sprayed to form 20 mm long Ag layers on both ends of the bulk rod. Then reporting $I_c$=220A, $J_c$=570 A/cm$^2$ and $R_c$~0.1-0.2 $\mu\Omega$ under self-field at 77 K for rods of dimension: $\phi$=7.0 mm, L=200 mm. Whereas, the latter method make use of co-precipitation route for the synthesis of calcined powder which is then cold isostatically into rods followed by steps of sintering, cold isopressing pressing and then sintering. Then reporting advantages of high compactness and high current load capacity.

Unlike in both the above methods, where only one cold isopressing step in between two sintering was performed, in U.S. Pat. No. 6,216,333, Kojima et al. disclosed a method with inclusion of two intermediate cold isopressing steps in between three sintering (each sintering step is of 50 hours). After completion of final sintering, these sintered rods (diameter=7 mm and length=150 mm) were grounded by means of a lathe machine into final thinner rods (diameter=4.2 mm and length=145 mm) followed by a process of making end silver contacts and another step of sintering to obtain rod current leads. Then reporting high $I_c$=710 A (calculated value of $J_c$=5,100 A/cm$^2$) at 77K in zero field for 145 mm long rods having 4.2 mm diameter. However, like the above methods, this method not only suffers from introduction of fine compaction cracks due to intermediate CIP but also cracks developed during turning. This not only hampers reliability of the final product but also makes it mechanically weak.

Although, the above CIP process of preparation of Bi-2223 rods and by using intermediate CIP steps in between sintering steps discussed in the above methods cause the intermediate liquid phases rich in Ca, Cu to spread perpendicular the packing direction and this leads to alignment of the Bi-2223 platelets during subsequent heat treatment thereby increasing density of the specimen, however, this method still suffers from the presence of Ca, Cu rich secondary phases. In addition, undesirable of fine compaction cracks due to intermediate cold iso pressings are also introduced and total sintering is about 200 to 250 hours. This tendency of undesired residual phases and fine compaction cracks increases as the diameter of the rods increases. Thus, hampers reproducibility and cost. It is further to add that, in the above prior art methods where entire sintering is done in rod shape only and that too without intermediate crushing and mixing steps, generally thicker rods of diameter not less than 4.2 mm have been reported.

To minimize the traces of secondary phases, to avoid the use of: any organic binder, intermediate CIP steps and/or turning after completion of final sintering to fabricate thinner rods, another method of preparation of Bi-2223 rods is disclosed in reference Japan. J. App. Phys, vol. 44, No. 11, p. 7943 (2005) by Padam et al. This method differs from the prior art methods in three steps. First: starting powder contains silver. Second: sintering is done by cold isopressing of modified calcined powder first in tube shape (unlike generally rod shape in all the above methods). Third, crushing the initially sintered tube into powder (which has rarely been done after initial sintering in the above methods) to obtain a homogeneous powder for final sintering. This initially sintered tube powder is cold isostatically pressed (pressure of 400 MPa) into 120 mm long rods of 3 mm diameter followed by a process of making of grooves at both ends of these rods. Then a three layer silver metal contact is made on these grooves using a metal spray gun. Finally, this entire assembly was sintered in air. This process reduced the total sintering duration by about 40 hours from the conventional method. Then reporting final Bi-2223 rods with rarely found secondary phases and these rods have $J_c$ of the order of 785 A/cm² ($I_c$=55.5 A) and contact resistance of the order 0.45 μOhm at 77 K in self-field. At the same time these rods have reasonably good fracture strength of about 115 MPa. Although this method led to relatively good quality Bi-2223 rods and that too in 40 hours shorter sintering duration, however, drawback of this method is that the obtained $J_c$ and fracture strength values are still not high.

From the hitherto know prior art, as detailed above, it is clear that there is a definite need to develop an improved process for the preparation of oxide superconducting lead in rod shape and oxide superconducting current leads made thereby.

OBJECTIVES OF THE INVENTION

The main object of the present invention is to provide an improved method for preparation of oxide superconducting rod current leads.

Another object of the present invention is to provide an oxide superconducting rod, wherein the oxide superconductor is of $(Bi,Pb)_2Sr_2Ca_2Cu_2O_{10+1}$ abbreviated as (Bi,Pb)-2223 material which is particularly preferable in view of its high critical temperature ($T_c$), a high critical current density ($J_c$), better environmental resistant, low toxicity.

Yet another object of the present invention is to provide relatively easy fabrication of oxide superconducting rod than other oxide high temperature superconductor (like La-based, Y-based, TI-based etc.), preceded other oxide superconductors in the development of current leads.

Yet another object of the present invention is to provide Ag added (Bi, Pb)-2223 oxide superconducting rod to improve fracture strength and critical current density.

Yet another object of the present invention is to provide process for the preparation of oxide rod current leads of small diameter particularly useful for scanners in space crafts, low current magnets, electronic devices like.

SUMMARY OF THE INVENTION

Accordingly, the present invention provides a process for the preparation of oxide superconducting rods; the said process comprising the steps of:

i) spray drying a nitrate solution of Bi,Pb,Sr,Ca,Cu and Ag to obtain the spray dried powder;

ii) heating the above said spray dried powder obtained in step (i) at a temperature of 800-900° C., for a period of 1-2 hours in air to obtain the calcined powder;

iii) cold isopressing the calcined powder obtained in step (ii) into a tube;

iv) sintering the tube obtained in step (iii) at a temperature of 800-850° C., for a period of 20-30 hours;

v) crushing and mixing the sintered tube obtained in step (iv) to obtain the partially preformed tube powder;

vi) filling the above partially preformed tube powder obtained in step (v) into a rubber mould;

vii) cold isopressing the above said partially preformed powder into rod;

viii) initial sintering of rod obtained as such in step (vi) or in a silver tube;

ix) roughing both the end portions of the sintered rod obtained in to step (viii) with a subsequent deposition of a first layer of metal silver and further wrapping it with a perforated silver sheet, followed by further deposition of another metal silver over it;

x) finally sintering the whole assembly of initially sintered rod and both end contacts, at a temperature in the range of 800-850° C., for a period of 25-50 hours to obtain the desired oxide superconducting rod.

In an embodiment of the present invention the cold isopressing of the calcined powder in steps (iii) and (vi) is carried out at pressure of 100-200 MPa.

In yet another embodiment the rubber mould used in step (vi) is wrapped with a perforated metal sheet.

In yet another embodiment the rubber mould used in step (vi) has an inner surface coated with olive oil.

In yet another embodiment the initial sintering of rod as such or in a silver tube in step (viii) is carried out at a temperature in the range of 830° C. to 850° C. in air, for a period in the range of 50 to 100 hours In yet another embodiment the sintering of whole assembly in step (x) is carried out at a temperature of 830° C. to 850° C. in air, for a period of 25 to 50 hours In yet another embodiment the oxide superconducting rod obtained has the following characteristics:

a) critical current density ($J_c$) of the rod current lead is in the range of 1039 to 1297 A/cm² at 77K in self field;

b) contact resistivity of the rod current lead is in the range of 0.007 to 0.015 μOhm-cm² at 77K in self field, c) fracture strength of the superconducting rod leads in the range of 140 to 170 MPa, d) reproducibility of the order of more than 60% in 100-150 hours of total sintering duration, e) oxide superconducting current lead is a rod of diameter in the range of 2 to 3.2 mm and length in the range of 98 to 145 mm.

In a still further embodiment of the present invention, inner surface of the rubber mould wrapped with a metal sheet is not coated with a layer of olive oil before filling the partially preformed tube powder.

In another embodiment of the present invention, inner surface of the rubber mould wrapped with a perforated metal sheet is first coated with olive oil before filling the partially preformed tube powder.

In another embodiment of the present invention, the quantity of olive oil vary from 2 to 5 drops.

In yet another embodiment of the present invention, the cold isopressing of the partially sintered tube powder into rods of different dimensions is effected at a pressure in the range of 300 to 400 MPa.

In a still another embodiment of the present invention, the surface of the rods is immediately cleaned with acetone so that no trace of olive oil is left.

In a further embodiment of the present invention, initial sintering of the rod is carried out in an alumina sager in the temperature range of 830°-850° C. in air for a period in the range of 50-100 hours.

In yet another embodiment of the present invention, the forming of metallic contacts at both end parts of said initially sintered rod consists of roughing of both end parts of the superconductor, depositing a first silver layer by metal spray gun, wrapping a perforated silver foil on the said silver layer, depositing a second silver layer by a metal spray gun on the said perforated silver foil; final sintering the said combination of first silver layer, wrapping silver foil and second silver layer is effected at a temperature in a range of 830° to 850° C. in air for a time period in the range of 25 to 50 hours, to obtain a rod current lead.

DETAIL DESCRIPTION OF THE INVENTION

The present invention provides a process for the preparation of oxide superconducting bulk rod current leads from bismuth based oxide superconductor $[(Bi,Pb)_2 Sr_2Ca_2Cu_3O_{10+x}]$ and superconducting bulk rod current leads made thereby, comprising : a step of preparing separate metal cation solutions of Bi,Pb,Sr,Ca,Cu and Ag and mixing the solution so obtained, a step of spray drying the said mixed cation solution to obtain a starting powder, a step of heating the said dried powder to obtain a homogeneous calcined powder, a step of cold isopressing the said calcined powder into a tube shape followed by sintering, a step of crushing and mixing the said sintered tube to obtain a homogeneous partially preformed precursor powder for development of rod, a step of cold isopressing the said homogeneous precursor powder into a rod shape, a step of initial sintering the said rod by keeping in an alumina sager and/or silver tube, a step of roughing both ends of the said sintered rod, a step of making silver contacts on the said rough ends, and a step of final sintering of said assembly of rod and silver contacts, to thereby obtain a bulk rod current lead.

The present invention provides oxide superconducting rods from bismuth based cuperate$[(Bi,Pb)_2Sr_2Ca_2Cu_3O_{10+x}]$, having properties such as $I_c$ in the range of 36 to 100 A and contact resistivity in the range of 0.007-0.012 $\mu$Ohm-cm$^2$ at 77 K in self-field and fracture strength in the range of 140-170 MPa The oxide superconductor (Bi, Pb)-2223 rods are of small diameter to be used in the smaller scale applications such as; current leads for low current magnets, scanners in space crafts, in cryogenic experiments and the like. In this case of such oxide superconductors a fixed composition: $Bi_{1.84}Pb_{0.35}Sr_{1.91}Ca_{2.05}Cu_{3.05}(Ag_{1.2})$ is selected to obtain a nearly single phasic Bi-2223 superconducting material. The novelty of the present invention for the preparation of oxide bulk rod current leads lies in the improvement in the method such as making thin rods without the use of binder/solvent and intermediate cold isopressing steps.

The novelty of the present invention for the preparation of oxide superconducting bulk rods from bismuth based (Bi, Pb)$_2$Sr$_2$Ca$_2$Cu$_3$O$_{10+1}$ has been achieved by the non obvious inventive steps of:

1. applying olive oil on inner surface of the flexible rubber mould for easy separation of the rod from the rubber mould;
2. cleaning immediately the surface of the rod with acetone so that no trace of olive oil is left;
3. wrapping the flexible rubber mould with a perforated metal sheet to prevent it from
4. sagging during CIP step;
5. packing the flexible rubber bag packed with sintered powder without binder/solvent to prevent the formation of crack/void during sintering process;
6. sintering of the rod from cold isostatically pressed sintered powder in a silver tube to achieve initial grain alignment with controlled grain growth;

Thus the novel characteristics have been achieved by non obvious inventive steps of application of olive oil on inner surface of the rubber mould, initial sintering in silver tube and by following simple/minimum steps as detailed herein above.

The critical temperature ($T_c$), critical current ($I_c$) and the contact resistance ($R_c$) of the silver added (Bi,Pb)-2223 rods prepared by the process of the present invention described herein above were measured by standard four-terminal method. In four probe method, for voltage taps, air-drying silver paste was used and connecting copper leads were soldered directly to the superconductor close to the current contacts. Accuracy of the measurements was about ±10%. The measurements for $I_c$, $R_c$ and a were at 77K. Fracture strength ($\sigma$) was measured on circular disks of thickness 3 to 5 mm cut from rods. Scanning electron microscope (SEM) was used to characterize the microstructure of the samples to see the effect of sintering initially in Ag tube on the grain orientation, grain size and grain size variation.

Figure 1:
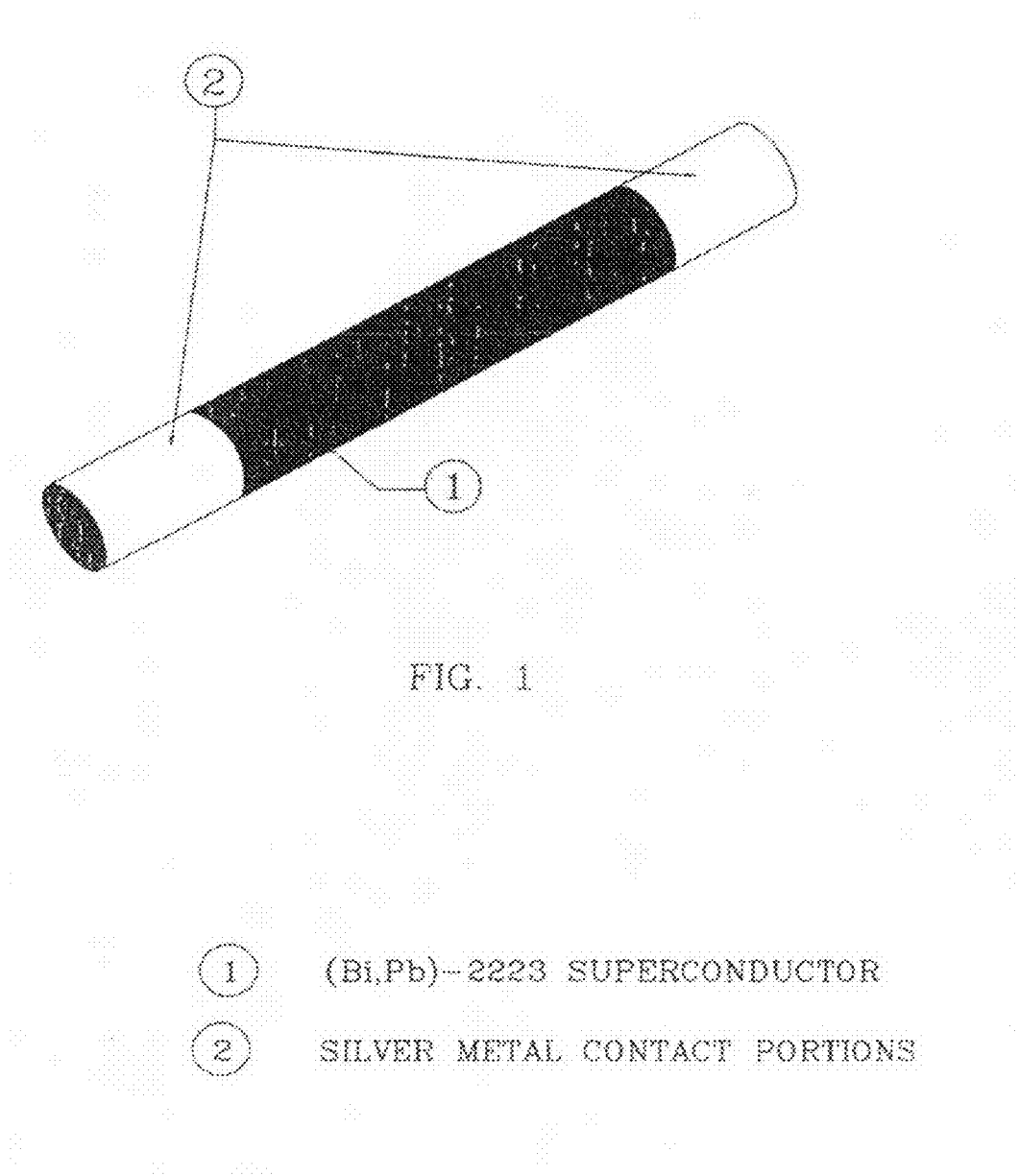
In FIG. 1 of the drawings accompanying this specification are shown complete oxide superconducting rod lead. In figure, numeral 1 designates a (Bi,Pb)-2223 superconductor; and numeral 2 designates silver metal end contact portion.
Figure 2:
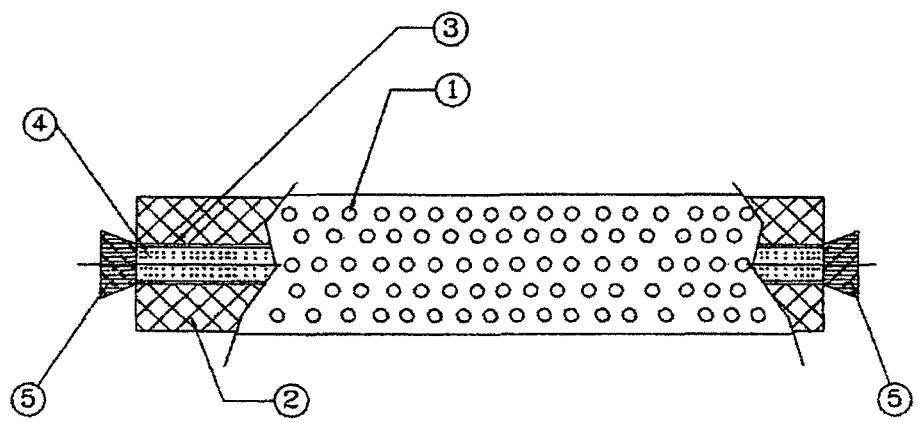
FIG. 2 is a cross-sectional drawing of an assembly as used for cold isopressing in the development of oxide superconducting rods in accordance with the present invention. In this figure, reference numeral 1 is a perforated metal sheet; reference 2 is a rubber mould; reference numeral 3 is a layer of olive oil; and reference numeral 4 is a partially preformed superconducting powder; and reference numeral 5 designates a rubber cork.

The following examples are given by way of illustration and therefore, should not be construed to limit the scope of the present invention.

EXAMPLE-1

Precursor powder was prepared by weighing each raw material nitrate powder of the constituent elements Bi,Pb,Sr, Ca,Cu and Ag in mole ratio of 1.84:0.35:1.91:2.05:3.05:1.2. These were dissolved in double distilled water and spray dried. This spray dried powder was then introduced into a furnace preheated to 800° C. and calcined for 1 hour in air. The calcined powder was cold iso-statically pressed at a pressure of 200 MPa into a tube of length (L) 200 mm and of outer diameter (OD) of 50 mm and inner diameter (ID) of 48 mm.

Then this tube was sintered at 830° C. in air for 25 hours followed by crushing and mixing to obtain partially preformed tube powder material.

The partially preformed tube powder (5.8 gm) was then filled in a flexible rubber mould (I D=4 mm, OD=7 mm, L=150 mm) wrapped with a perforated metal sheet and one of the ends of the rubber mould was closed with a rubber cork. After filling of the sintered tube powder, other end of the mould was also closed with a rubber cork and the entire assembly was subjected to vacuum of 200 millitorr. Then this assembly was placed in a perforated metal container and isostatically pressed at a pressure of 400 MPa. Thus, a rod of length=145 mm and diameter=3.2 mm was obtained. Then both ends (15 mm long) of this sintered rod were roughed with a subsequent deposition of a first layer of silver by a metal spray gun. Next, a perforated silver foil was wrapped around the first metal spray deposited silver layer. After the silver foil was wrapped completely leaving a small-unwrapped portion for making external contacts, another silver layer was metal deposited.

This assembly, that is, rod with both ends silver contacts was finally sintered in air in alumina sager for 100 hours to obtain a Ag added (Bi,Pb)-2223 rod current lead of length=145 mm and diameter=3.2 mm.

Critical temperature ($T_c$) of the rod was measured and the value obtained was 115 K. Contact resistivity (Rc) of this rod at 77K in zero-magnetic field was measured and the value achieved was 0.015 µOhm-cm$^2$. At this time, the critical current ($I_c$) measured was 100A. If converted this critical current to a critical current density ($J_c$) was 1242 A/cm$^2$. The fracture strength of 140 MPa was obtained at 77K. The obtained results are shown in Table1.

EXAMPLE-2

Precursor powder was prepared by weighing each raw material nitrate powder of the constitute elements Bi, Pb, Sr, Ca, and Cu in mole ratio of 1.84:0.35:1.91:2.05:3.05:1.2. These were dissolved in double distilled water and spray dried. This spray dried powder was then introduced into a furnace preheated to 800° C. and calcined for 1 hour in air. The calcined powder was cold iso-statically pressed at a pressure of 200 MPa into a tube of length (L) 200 mm and of outer diameter (OD) of 50 mm and inner diameter (ID) of 48 mm. Then this tube was sintered at 830° C. in air for 25 hours followed by crushing and mixing to obtain partially preformed tube powder material.

The partially preformed tube powder (4.0 gm) was then filled in a flexible rubber mould (ID=4 mm, OD=7 mm, L=150 mm) wrapped with a perforated metal sheet and one of the ends of the rubber mould was closed with a rubber cork. After filling of the sintered tube powder, other end of the mould was also closed with a rubber cork and the entire assembly was subjected to vacuum of 200 millitorr. Then this assembly was placed in a container and isostatically pressed at a pressure of 400 MPa. Thus, a rod of length=132 mm and diameter=2.5 mm was obtained. Then both ends (15 mm long) of this sintered rod were roughed with a subsequent deposition of a first layer of silver by a metal spray gun. Next, a perforated silver foil was wrapped around the first metal spray deposited silver layer. After the silver foil was wrapped completely leaving a small-unwrapped portion for making external contacts, another silver layer was metal deposited.

This assembly, that is, rod with both ends silver contacts was finally sintered in air in alumina sager for 100 hours to obtain a Ag added (Bi,Pb)-2223 rod current lead of length=132 mm and diameter=3.2 mm.

Critical temperature ($T_c$) of the rod was measured and the value obtained was 115 K. Contact resistivity (Rc) of this rod at 77K in zero-magnetic field was measured and the value achieved was 0.012 µOhm-cm$^2$. At this time, the critical current ($I_c$) measured was 55A. If converted this critical current to a critical current density ($J_c$) was 1083A/cm$^2$. The fracture strength of 159 MPa was obtained at 77K. The obtained results are shown in Table1.

EXAMPLE-3

Precursor powder was prepared by weighing each raw material nitrate powder of the constitute elements Bi, Pb, Sr, Ca, and Cu in mole ratio of 1.84:0.35:1.91:2.05:3.05:1.2. These were dissolved in double distilled water and spray dried. This spray dried powder was then introduced into a furnace preheated to 800° C. and calcined for 1 hour in air. The calcined powder was cold iso-statically pressed at a pressure of 200 MPa into a tube of length (L) 200 mm and of outer diameter (OD) of 50 mm and inner diameter (ID) of 48 mm. Then this tube was sintered at 830° C. in air for 25 hours followed by crushing and mixing to obtain partially preformed tube powder material.

The partially preformed tube powder (2.8 gm) was then filled in a flexible rubber mould (ID=4 mm, OD=7 mm, L=150 mm) wrapped with a perforated metal sheet and one of the ends of the rubber mould was closed with a rubber cork. After filling of the tube sintered powder, other end of the mould was also closed with a rubber cork and the entire assembly was subjected to vacuum of 200 millitorr. Then this assembly was placed in a container and isostatically pressed at a pressure of 400 MPa. Two broken rod pieces each of diameter=2.1 mm and lengths of 98 mm and 22 mm were obtained. Then both ends (10 mm long) of the 98 mm longer rod piece were roughed with a subsequent deposition of a first layer of silver by a metal spray gun. Next, a perforated silver foil was wrapped around the first metal spray deposited silver layer. After the silver foil was wrapped completely leaving a small-unwrapped portion for making external contacts, another silver layer was metal deposited.

This assembly, that is, rod with both ends silver contacts was finally sintered in air in alumina sager for 100 hours to obtain a Ag added (Bi,Pb)-2223 rod current lead of length=98m and diameter=2.1 mm.

Critical temperature ($T_c$) of the rod was measured and the value obtained was 115 K. Contact resistivity (Rc) of this rod at 77K in zero-magnetic field was measured and the value achieved was 0.010 µOhm-cm$^2$. At this time, the critical current ($I_c$) measured was 36 A. If converted this critical current to a critical current density ($J_c$) was 1039A/cm$^2$. The fracture strength of 150 MPa was obtained at 77K. The obtained results are shown in Table1.

EXAMPLE-4

Precursor powder was prepared by weighing each raw material nitrate powder of the constitute elements Bi, Pb, Sr, Ca, and Cu in mole ratio of 1.84:0.35:1.91:2.05:3.05:1.2. These were dissolved in double distilled water and spray dried. This spray dried powder was then introduced into a furnace preheated to 800° C. and calcined for 1 hour in air. The calcined powder was cold iso-statically pressed at a pressure of 200 MPa into a tube of length (L) 200 mm and of outer diameter (OD) of 50 mm and inner diameter (ID) of 48 mm. Then this tube was sintered at 830° C. in air for 25 hours followed by crushing and mixing to obtain partially preformed tube powder material.

The partially preformed tube powder (2.8 gm) was then filled in a flexible rubber mould (ID=4 mm, OD=7 mm, L=150 mm) wrapped with a perforated metal sheet and one of the ends of the rubber mould was closed with a rubber cork. Then inside of the rubber mould was coated with a layer of olive oil and the mould was filled with the powder. After filling of the powder, other end of the mould was also closed with a rubber cork and the entire assembly was subjected to vacuum of 200 millitorr. Then this assembly was placed in a container and isostatically pressed at a pressure of 400 MPa. Thus, a rod of length=120 mm and diameter =2.1 mm was obtained. Surface of this rod was immediately cleaned with acetone so that no race of olive oil is left. This rod was kept in an alumina sager and sintered in air at 830° C. for 75 hours. Both ends (10 mm long) of this sintered rod were roughed with a subsequent deposition of a first layer of silver by a metal spray gun. Next, a perforated silver foil was wrapped around the first metal spray deposited silver layer. After the silver foil was wrapped completely leaving a small-unwrapped portion for making external contacts, another silver layer was metal deposited.

This assembly, that is, rod with both ends silver contacts was finally sintered in air in alumina sager for 25 hours to obtain a Ag added (Bi,Pb)-2223 rod current lead of length=120 mm and diameter=2.1 mm.

Critical temperature($T_c$) of the rod was measured and the value obtained was 115 K. Contact resistivity (Rc) of this rod at 77K in zero-magnetic field was measured and the value achieved was 0.010 µOhm-cm$^2$. At this time, the critical current ($I_c$) measured was 38 A. If converted this critical current to a critical current density ($J_c$) was 1096A/cm$^2$. The fracture strength of 154 MPa was obtained at 77K. The obtained results are shown in Table 1.

Figure 4:
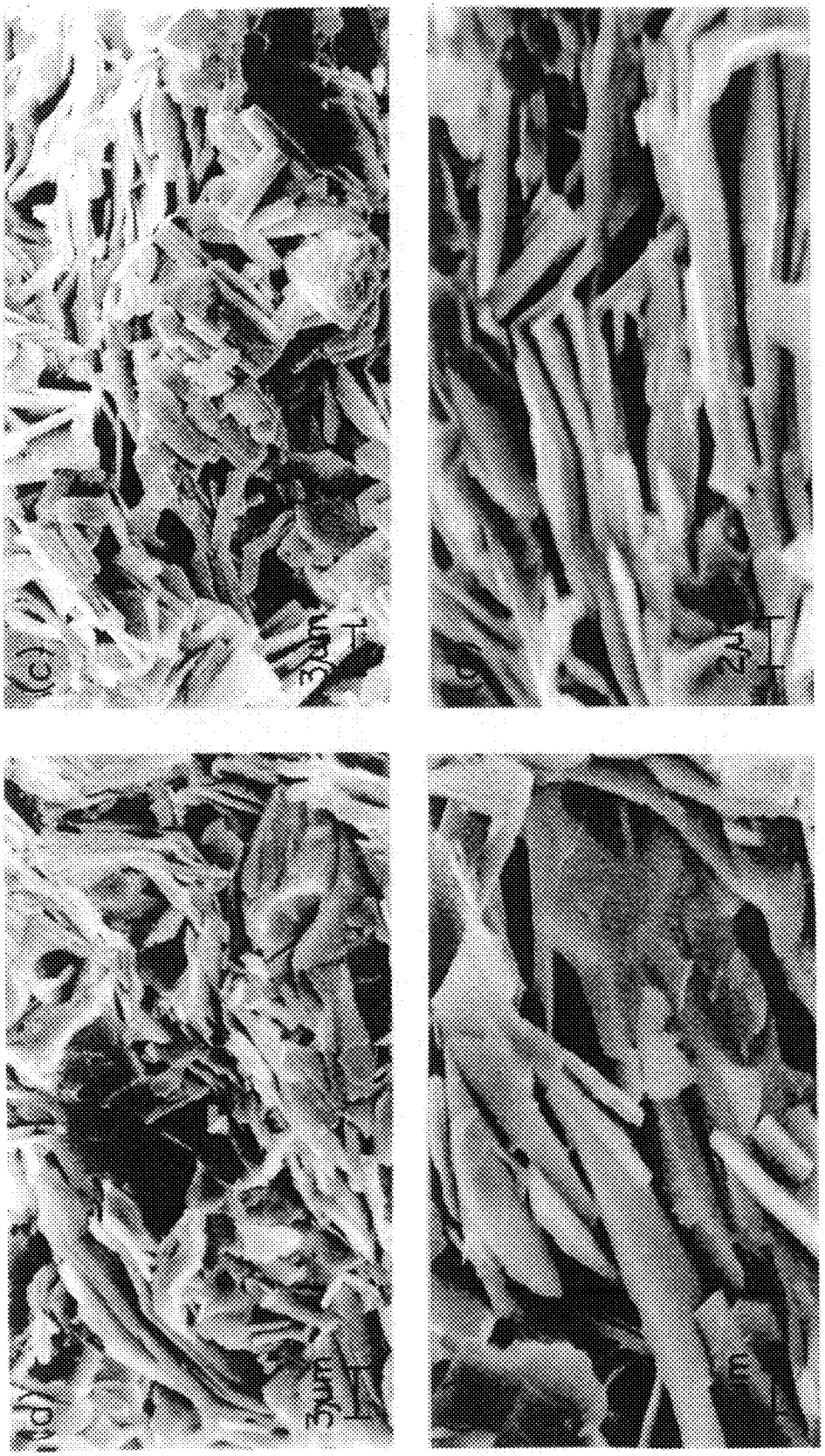
FIG. 4 is a comparison of the SEM microstructure of the cross-section of rods developed according to the present invention; showing an effect of initial sintering in alumina sager (a,b) and in Ag tube (c,d) on the grain alignment and grain size variation.

SEM micrograph in FIG. 4 of the longitudinal fractured surface of the rod sintered initially in alumina sager at 830° C. for 75hours (a) shows a fair alignment of superconducting grains and a large grain size variation (4-23 µm). This grain alignment increases and variation in grain size decreases on finally sintering for another 25 hours (b).

EXAMPLE-5

Precursor powder was prepared by weighing each raw material nitrate powder of the constitute elements Bi, Pb, Sr, Ca, and Cu in mole ratio of 1.84:0.35:1.91:2.05:3.05:1.2. These were dissolved in double distilled water and spray dried. This spray dried powder was then introduced into a furnace preheated to 800° C. and calcined for 1 hour in air. The calcined powder was cold iso-statically pressed at a pressure of 200 MPa into a tube of length (L) 200 mm and of outer diameter (OD) of 50 mm and inner diameter (ID) of 48 mm. Then this tube was sintered at 830° C. in air for 25 hours followed by crushing and mixing to obtain partially preformed tube powder material.

The partially preformed tube powder (2.8 gm) was then filled in a flexible rubber mould (ID=4 mm, OD=7 mm, L=150 mm) wrapped with a perforated metal sheet and one of the ends of the rubber mould was closed with a rubber cork. Then inner surface of the rubber mould was coated with three drops of olive oil before filling the powder. After filling of the powder in the olive oil coated rubber mould, other end of the mould was also closed with a rubber cork and this assembly was subjected to vacuum of 200 millitorr. Then this assembly was placed in a container and isostatically pressed at a pressure of 400 MPa. Thus, a rod of length=120 mm and diameter=2.1 mm was obtained. Surface of this rod was immediately cleaned with acetone so that no trace of olive oil is left. This rod was then kept in a silver tube (ID=4 mm, OD=7 mm L=120 mm) and sintered in air at 830° C. for 75 hours. Then both ends (10 mm long) of this sintered rod were roughed with a subsequent deposition of a first layer of silver by a metal spray gun. Next, a perforated silver foil was wrapped around the first metal spray deposited silver layer. After the silver foil was wrapped completely leaving a small-unwrapped portion for making external contacts, another silver layer was metal deposited.

This assembly, that is, rod with both ends silver contacts was finally sintered in air for 25 hours in alumina sager to obtain a Ag added (Bi,Pb)-2223 rod current lead of length=120 mm and diameter=2.1 mm.

Critical temperature ($T_c$) of the rod was measured and the value obtained was 115 K. Contact resistivity (Rc) of this rod at 77K in zero-magnetic field was measured and the value achieved was 0.007 µOhm-cm$^2$. At this time, the critical current ($I_c$) measured was 45 A. If converted this critical current to a critical current density ($J_c$) was 1297 A/cm$^2$. The fracture strength of 163 MPa was obtained at 77K. The obtained results are shown in Table 1.

SEM micrographs in FIG. 4(*c*) of the longitudinal fractured surface of the rods sintered initially in Ag tube at 830° C. in air for 75 hours show a good grain alignment and less variation in grain size (4 -12 µm). This grain alignment improves and grain size variation decreases further in finally sintered rods (FIG. 4*d*). As compared to those of the rods sintered first in alumina sager (FIGS. 4*a, b*) which show a fair grain alignment and a large grain size variation, it indicates that sintering first in Ag tube has resulted in a rod having comparatively improved microstructure. This improved microstructure in rods sintered initially in silver tube probably has led to higher $J_c$ (1297A/cm$^2$), higher σ(163 MPa) and lower Rc (0.007 µm-cm$^2$) values when compared to lower $J_c$ (1096 A/cm$^2$), lower σ (154 MPa) and higher Rc (0.010 vm-cm$^2$) values.

EXAMPLE-6

Precursor powder was prepared by weighing each raw material nitrate powder of the constitute elements Bi, Pb, Sr, Ca, and Cu in mole ratio of 1.84:0.35:1.91:2.05:3.05:1.2. These were dissolved in double distilled water and spray dried. This spray dried powder was then introduced into a furnace preheated to 800° C. and calcined for 1 hour in air. The calcined powder was cold iso-statically pressed at a pressure of 200 MPa into a tube of length (L) 200 mm and of outer diameter (OD) of 50 mm and inner diameter (ID) of 48 mm. Then this tube was sintered at 830° C. in air for 25 hours followed by crushing and mixing to obtain partially preformed tube powder material.

The partially preformed tube powder (2.5 gm) was then filled in a flexible rubber mould (ID=4 mm, OD=7 mm, L=150 mm) wrapped with a perforated metal sheet and one of the ends of the rubber mould was closed with a rubber cork. Then inner surface of the rubber mould was coated with three drops of olive oil before filling the powder. After filling of the powder in the olive oil coated rubber mould, other end of the mould was also closed with a rubber cork and this assembly was subjected to vacuum of 200 millitorr. Then this assembly was placed in a container and isostatically pressed at a pressure of 400 MPa. Thus, a rod of length=120 mm and diameter=2.0 mm was obtained. Surface of this rod was cleaned immediately with acetone so that no trace of olive oil is left. This rod was then kept in a silver tube (ID=4 mm, OD=7 mm, L=120 mm) and sintered in air at 830° C. for 75 hours. Then both ends (10 mm long) of this sintered rod were roughed with a subsequent deposition of a first layer of silver by a metal spray gun. Next, a perforated silver foil was wrapped around the first metal spray deposited silver layer. After the silver foil was wrapped completely leaving a small-unwrapped portion for making external contacts, another silver layer was metal deposited.

This assembly, that is, rod with both ends silver contacts was finally sintered in air in alumina sager for 25 hours to obtain a Ag added (Bi,Pb)-2223 rod current lead of length (L)=120 mm and diameter (Ø)=2.0 mm.

Figure 3:
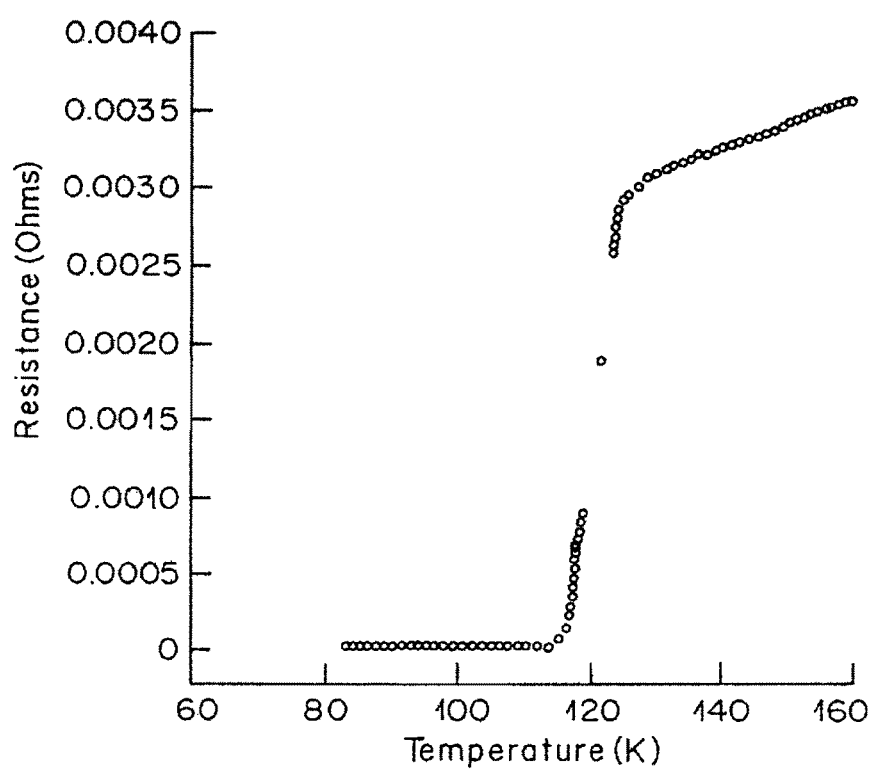
FIG. 3 is a resistivity versus temperature graph for oxide superconducting rods developed in accordance with the present invention showing $T_c$ of 115K.

Critical temperature ($T_c$) of the rod was measured and the value obtained was 115K as shown in FIG. 3. Contact resistivity (Rc) of this rod at 77K in zero-magnetic field was measured and the value achieved was 0.007 µOhm-cm$^2$. At this time, the critical current ($I_c$) measured was 43 A. If converted this critical current to a critical current density ($J_c$) was 1368 A/cm$^2$. The fracture strength of 170 MPa was obtained at 77K. The obtained results are shown in Table 1.

In Table-1 below is given the collated data from the above noted examples. The comparative data shows the critical current density, contact resistivity at 77 K in self-field and fracture strength (σ) of (Bi, Pb)-2223 thin rod current leads and also clearly highlights the novelty of not increase in contact resistivity and not decrease both in $J_c$ and σ, due to the non obvious inventive step of making thin rods of oxide superconducting material without the use of any binder.

TABLE-1

Superconducting and mechanical properties of oxide rods prepared from the present invention (77K, 0T)

| Sample No. | Size (L × Ø) (mm) | Critical Temp. $T_c$ (K) | Critical Current $I_c$ (A) | Critical Current Density $J_c$ (A/cm$^2$) | Contact Resistivity $R_c$ (µOhm-cm$^2$) | Fracture Strength (MPa) |
|---|---|---|---|---|---|---|
| 1 | 145 × 3.2 | ~115 | 100 | 1242 | 0.015 | 140 |
| 2 | 132 × 2.5 | ~115 | 55 | 1083 | 0.012 | 159 |
| 3 | 98 × 2.1 | ~115 | 36 | 1038 | 0.010 | 150 |
| 4 | 120 × 2.1 | ~115 | 38 | 1096 | 0.010 | 154 |
| 5 | 120 × 2.1 | ~115 | 45 | 1297 | 0.007 | 163 |
| 6 | 120 × 2.0 | ~115 | 43 | 1368 | 0.007 | 170 |

The Main Advantages of the Present Invention are:
1. It does not require any organic binder for fabrication of oxide superconducting rods
2. It does not require intermediate CIP steps while sintering.
3. It does not require turning of the finally sintered rods.
4. The olive oil used helps in easy separation of the cold isostatically pressed rod from the rubber mould without breaking the rod.
5. The silver tube used for sintering is compatible with oxide superconductor and leads to good grain alignment and less variation in grain size
6. Longer sintering durations are not required.
7. It leads to values of: $I_c$-36-100 A and contact resistivity in the range of 0.007 to 0.015 µOhm-cm$^2$ at 77 K in self-field which are sufficient for example: to energize low-$T_c$ superconducting magnets, for electronic components/devices and in scanners in space crafts etc.
8. It leads to reasonably good fracture strength in the range of 140-170 MPa.
9. It shows reliability and reproducibility data more than 60%.

The invention claimed is:

1. A process for the preparation of oxide superconducting rods, said process comprising the steps of:
   i) preparing a partially preformed tube powder obtained by grinding of a sintered tube made from isotatic pressing of calcined spray dried powder of Ag-added (Bi, Pb)$_2$Sr$_2$Ca$_2$Cu$_3$O$_{10+x}$ superconductor;
   ii) filling the above partially preformed tube powder obtained in step i) into a rubber mould;
   iii) cold isopressing the above said partially preformed powder into a rod;
   iv) initially sintering the rod obtained as such in step (iii) at a temperature in the range of 830-850° C., in air for a period of 50-100 hours;
   v) roughing both the end portions of the initially sintered rod obtained in step (iv) with a subsequent deposition of a first layer of metal silver and further wrapping it with a perforated silver sheet, followed by further deposition of another layer of metal silver over it; and,
   vi) finally sintering the whole assembly of initially sintered rod and both end contacts, at a temperature in the range of 800-850° C., for a period of 25-50 hours to obtain the desired oxide superconducting rod.

2. The process according to claim 1, wherein in step (ii) the rubber mould is wrapped with a perforated metal sheet.

3. The process according to claim 1, wherein in step (ii) the rubber mould used has an inner surface coated with olive oil.

4. The process according to claim 1, wherein in step (iv) the initial sintering of the rod is carried out in a silver tube.

* * * * *